(12) United States Patent
Yu et al.

(10) Patent No.: US 7,137,828 B2
(45) Date of Patent: Nov. 21, 2006

(54) REINFORCED FLEXIBLE PRINTED CIRCUIT BOARD

(75) Inventors: Cheng Hsien Yu, Miao-Li (TW); Hsueh Tien Chang, Miao-Li (TW); Mao-Yuan Huang, Miao-Li (TW)

(73) Assignee: Innolux Display Corp., Miao-Li (TW)

( * ) Notice: Subject to any disclaimer, the term of this patent is extended or adjusted under 35 U.S.C. 154(b) by 0 days.

(21) Appl. No.: 11/289,736

(22) Filed: Nov. 28, 2005

(65) Prior Publication Data

US 2006/0116005 A1    Jun. 1, 2006

(30) Foreign Application Priority Data

Nov. 26, 2004    (TW)    ............................. 93219058 U

(51) Int. Cl.
*H01R 12/00*    (2006.01)
(52) U.S. Cl. ...................................................... 439/67
(58) Field of Classification Search .................. 439/67, 439/77, 495, 876; 29/830; 360/97.01, 98.01, 360/133
See application file for complete search history.

(56) References Cited

U.S. PATENT DOCUMENTS

| 4,697,885 | A | * | 10/1987 | Minowa et al. | ............. | 349/149 |
|---|---|---|---|---|---|---|
| 4,715,928 | A | * | 12/1987 | Hamby | ......................... | 216/18 |
| 4,815,981 | A | * | 3/1989 | Mizuno | ....................... | 439/77 |
| 4,934,946 | A | * | 6/1990 | Ordway | ....................... | 439/77 |
| 5,004,899 | A | * | 4/1991 | Ueda | .......................... | 235/492 |
| 5,245,486 | A | * | 9/1993 | Hachiya et al. | .......... | 360/97.01 |
| 5,432,998 | A | * | 7/1995 | Galasco et al. | ............... | 29/830 |
| 6,668,447 | B1 | * | 12/2003 | Samant et al. | ................ | 29/830 |
| 6,940,024 | B1 | * | 9/2005 | Watanabe | ................... | 174/261 |

\* cited by examiner

*Primary Examiner*—Tulsidas C. Patel
*Assistant Examiner*—Harshad C Patel
(74) *Attorney, Agent, or Firm*—Wei Te Chung

(57) ABSTRACT

A reinforced flexible printed circuit board (20) includes a conductive portion (21) and a connection portion (22). The conductive portion includes a first metallic wire layer (23) having a plurality of conductive metallic wires, and two first Insulation layers (24). The connection portion includes a second metallic wire layer (26) having a plurality of conductive metallic wires, two second insulation layers (27), and a reinforcement board (29) having a hand-grip portion (291). The reinforcement board is attached to one of the second insulation layers to reinforce the connection portion, and the hand-grip portion is positioned at an end of the reinforcement board so that it is convenient for workers to assemble the reinforced flexible printed circuit board to other components.

7 Claims, 5 Drawing Sheets

REINFORCED FLEXIBLE PRINTED CIRCUIT BOARD

BACKGROUND OF THE INVENTION

1. Field of the Invention

The present invention relates to reinforced flexible printed circuit boards, and particularly to a reinforced flexible printed circuit board for connecting electrical circuits.

2. General Background

Quite a few electronic appliances such as liquid crystal display monitors need a flexible printed circuit board to connect a variety of electronic circuits together. FIG. 7 shows a conventional flexible printed circuit board 10. The flexible printed circuit board 10 includes a conductive portion 11 and a connection portion 12. The conductive portion 11 includes a first metallic wire layer 13 having a plurality of conductive metallic wires, and two first insulation layers 14. The connection portion 12 includes a second metallic wire layer 16 having a plurality of conductive metallic wires, two second insulation layers 17, and a reinforcement board 19. The metallic wires of the first metallic wire layer 13 are completely covered by the first insulation layers 14, and each of the metallic wires of the first metallic wire layer 13 is completely separate from the others. The metallic wires of the second metallic wire layer 16 are partly covered by the second insulation layers 17, and each of the metallic wires of the second metallic wire layer 16 is completely separate from the others. Ends of the metallic wires of the second metallic wire layer 16 are exposed. The metallic wires of the second metallic wire layer 16 are electrically connected with and correspond with the metallic wires of the first metallic wire layer 13. The reinforcement board 19 is attached to one of the second insulation layers 17; therefore the rigidity of the connection portion 12 is improved. However, when the flexible printed circuit board 10 is manually connected to a mating connector (not shown) of electric circuits of an associated appliance on an assembly line, the flexible printed circuit board 10 may be easily misaligned with the connector. When this happens, the flexible printed circuit board 10 may be Disconnected, or delays in assembly may occur.

Therefore, there is a need for a reinforced flexible printed circuit board that can be readily connected with other connectors.

SUMMARY

A reinforced flexible printed circuit board that can be easily assembled to other components is provided.

In an exemplary embodiment, the reinforced flexible printed circuit board includes a conductive portion and a connection portion. The conductive portion includes a first metallic wire layer having a plurality of conductive metallic wires and two first insulation layers. The connection potion includes a second metallic wire layer, two second insulation layers, and a reinforcement board. The second metallic wire layer includes a plurality of conductive metallic wires, and the reinforcement board includes a hand-grip portion. The metallic wires of the first metallic wire layer are completely covered by the first insulation layers, and each of the metallic wires of the first metallic wire layer is completely separate from the others. The metallic wires of the second metallic wire layer are partly covered by the second insulation layers. Each of the metallic wires of the second metallic wire layer is completely separate from the others, and ends of the metallic wires of the second metallic wire layer are exposed. The metallic wires of the second metallic wire layer are electrically connected with and correspond with those of the first metallic wire layer. The reinforcement board is attached to one of the second insulation layers, and the hand-grip portion is positioned at one end of the reinforcement board so that mechanical strength of the metallic wires of the second metallic wire layer is enhanced.

Unlike in the prior art, the reinforcement board of the above-described reinforced flexible printed circuit board includes a hand-grip portion. This makes it convenient to assemble the reinforced flexible printed circuit board to other components, thereby avoiding misalignments and problems such as open circuits.

Other advantages and novel features of embodiments of the present invention will become more apparent from the following detailed description when taken in conjunction with the accompanying drawings, in which:

DETAILED DESCRIPTION OF PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is defined by the appended claims and equivalents thereof.

Figure 1:
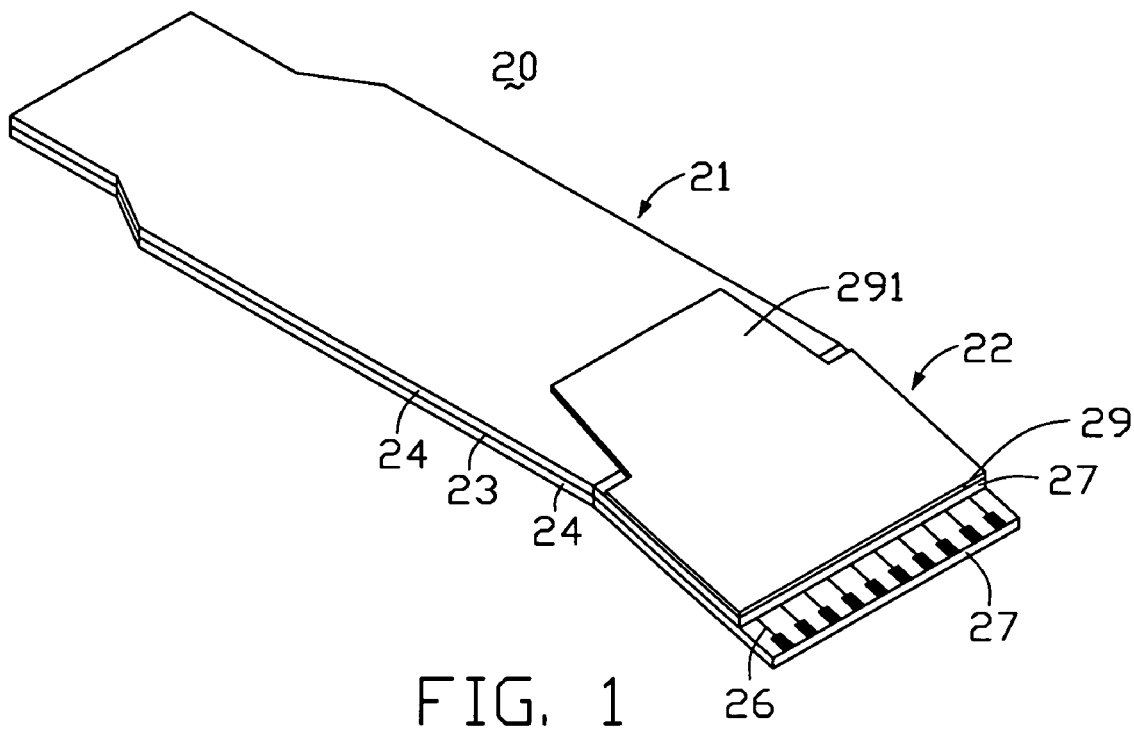
FIG. 1 is an isometric view of a reinforced flexible printed circuit board according to a first embodiment of the present invention.

Reference is made to FIG. 1, which is an isometric view of a reinforced flexible printed circuit board 20 according to a first embodiment of the present invention. The reinforced flexible printed circuit board 20 includes a conductive portion 21 and a connection portion 22. The conductive portion 21 includes a first metallic wire layer 23 having a plurality of conductive metallic wires, and two first insulation layers 24. The connection potion 22 includes a second metallic wire layer 26, two second insulation layers 27, and a reinforcement board 29. The second metallic wire layer 26 includes a plurality of conductive metallic wires. The reinforcement board 29 can be made of plastic and includes a hand-grip portion 291. The metallic wires of the first metallic wire layer 23 are completely covered by the first insulation layers 24, and each of the metallic wires of the first metallic wire layer 23 is completely separated from the others by the first insulation layers 24. The metallic wires of the second metallic wire layer 26 are partly covered by the second insulation layers 27. Each of the metallic wires of the second metallic wire layer 26 is completely separated from the others by the second insulation layers 27, and ends of the metallic wires of the second metallic wire layer 26 are exposed. The metallic wires of the second metallic wire layer 26 are electrically connected with and correspond with the metallic wires of the first metallic wire layer 23. The reinforcement board 29 is attached to one of the second insulation layers 27. The hand-grip portion 291 is integrally formed with and extends from the reinforcement board 29, so that the reinforced flexible printed circuit board 20 will not be unduly bent when the hand-grip portion 291 is manually pushed.

Figure 2:
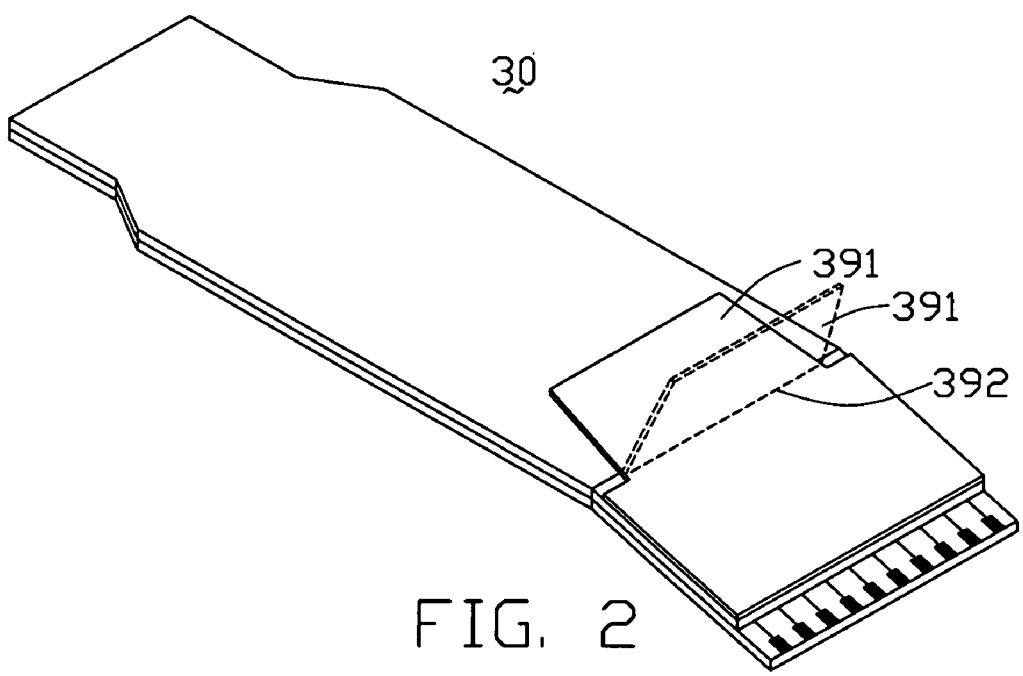
FIG. 2 is an isometric view of a reinforced flexible printed circuit board according to a second embodiment of the present invention.

Reference is made to FIG. 2, which is an isometric view of a reinforced flexible printed circuit board 30 according to a second embodiment of the present invention. The reinforced flexible printed circuit board 30 has a structure similar to that of the reinforced flexible PCB 20 of the first embodiment. The difference between the first embodiment and the second embodiment is that a hand-grip portion 391 of the reinforced flexible printed circuit board 30 further includes a bending line 392. Thus the hand-grip portion 391 is bendable at or torn off along the bending line 392, so that electrical signal interference of the hand-grip portion 391 has less impact.

Figure 3A:
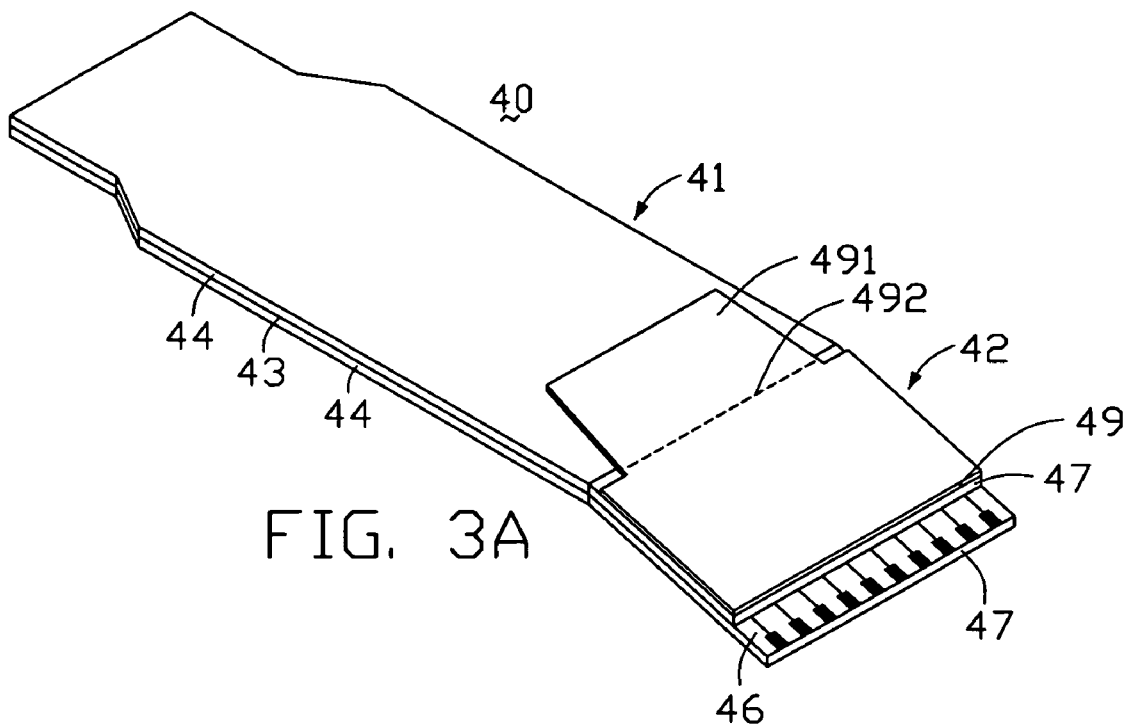
FIG. 3A is an isometric view of a reinforced flexible printed circuit board according to a third embodiment of the present invention.
Figure 3B:
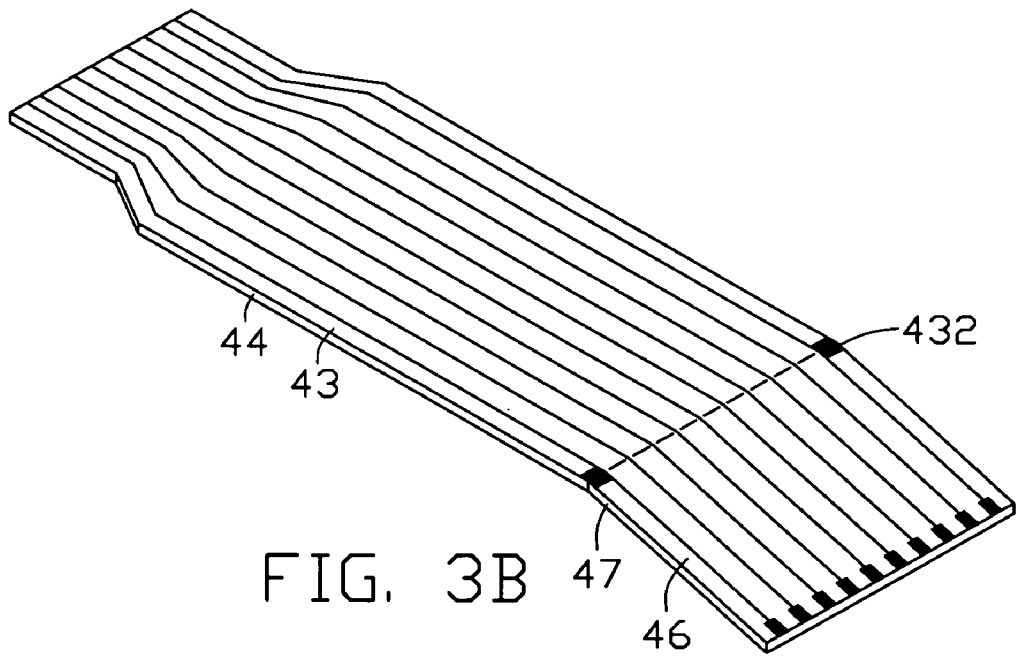
FIG. 3B is an isometric view of part of the reinforced flexible printed circuit board of FIG. 3A, showing a metallic wire layer thereof.

Reference is made to FIGS. 3A and 3B, which are isometric views relating to a reinforced flexible printed circuit board 40 according to a third embodiment of the present invention. The reinforced flexible printed circuit board 40 includes a conductive portion 41 and a connection portion 42. The conductive portion 41 includes a first metallic wire layer 43 having a plurality of conductive metallic wires, and two first insulation layers 44. The connection potion 42 includes a second metallic wire layer 46, two second insulation layers 47, and a reinforcement board 49. The second metallic wire layer 46 includes a plurality of conductive metallic wires, and the reinforcement board 49 includes a hand-grip portion 491 having a bending line 492. The metallic wires of the first metallic wire layer 43 are completely covered by the first insulation layers 44, and each of the metallic wires of the first metallic wire layer 43 is completely separated from the others by the first insulation layers 44. The metallic wires of the second metallic wire layer 46 are partly covered by the second insulation layers 47. Each of the metallic wires of the second metallic wire layer 46 is completely separated from the others by the second insulation layers 47, and ends of the metallic wires of the second metallic wire layer 46 are exposed. The metallic wires of the second metallic wire layer 46 are electrically connected with and correspond with the metallic wires of the first metallic wire layer 43. The reinforcement board 49 is made of plastic, and is attached to one of the second insulation layers 47. The hand-grip portion 491 is integrally formed with and extends from the reinforcement board 49, so that the reinforced flexible printed circuit board 40 will not be unduly bent when the hand-grip portion 491 is manually pushed. Two spaced-apart copper-covered areas 432 are attached to an area where the first insulation layers 44 adjoin the second insulation layers 47, in order to help prevent the reinforced flexible printed circuit board 40 from being broken by manual handling.

Figure 4:
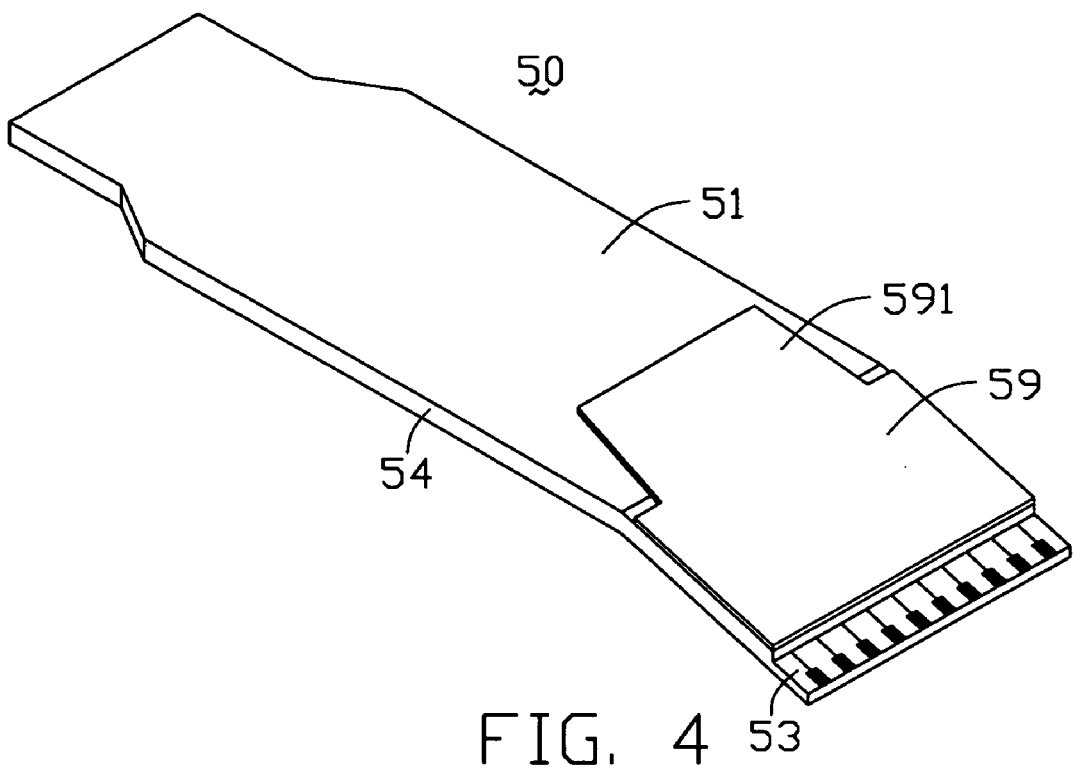
FIG. 4 is an isometric view of a reinforced flexible printed circuit board according to a fourth embodiment of the present invention.

Reference is made to FIG. 4, which is an isometric view of a reinforced flexible printed circuit board 50 according to a fourth embodiment of the present invention. The reinforced flexible printed circuit board 50 includes a flexible printed circuit board 51 and a reinforcement board 59. The flexible printed circuit board 51 includes a first metallic wire layer 53 having a plurality of conductive metallic wires, and a first insulation layer 54. The reinforcement board 59 is made of plastic and includes a hand-grip portion 591. Ends of the metallic wires of the first metallic wire layer 53 are exposed. The metallic wires 51 of the first metallic wire layer 53 are partly covered by the first insulation layer 54, and are completely separated from each other by the first insulation layer 54. The reinforcement board 59 is attached to a bent end of the flexible printed circuit board 51 where the ends of the metallic wires of the first metallic wire layer 53 are exposed. Thus the reinforced flexible printed circuit board 50 will not be unduly bent when the hand-grip portion 591 is manually pushed.

Figure 5:
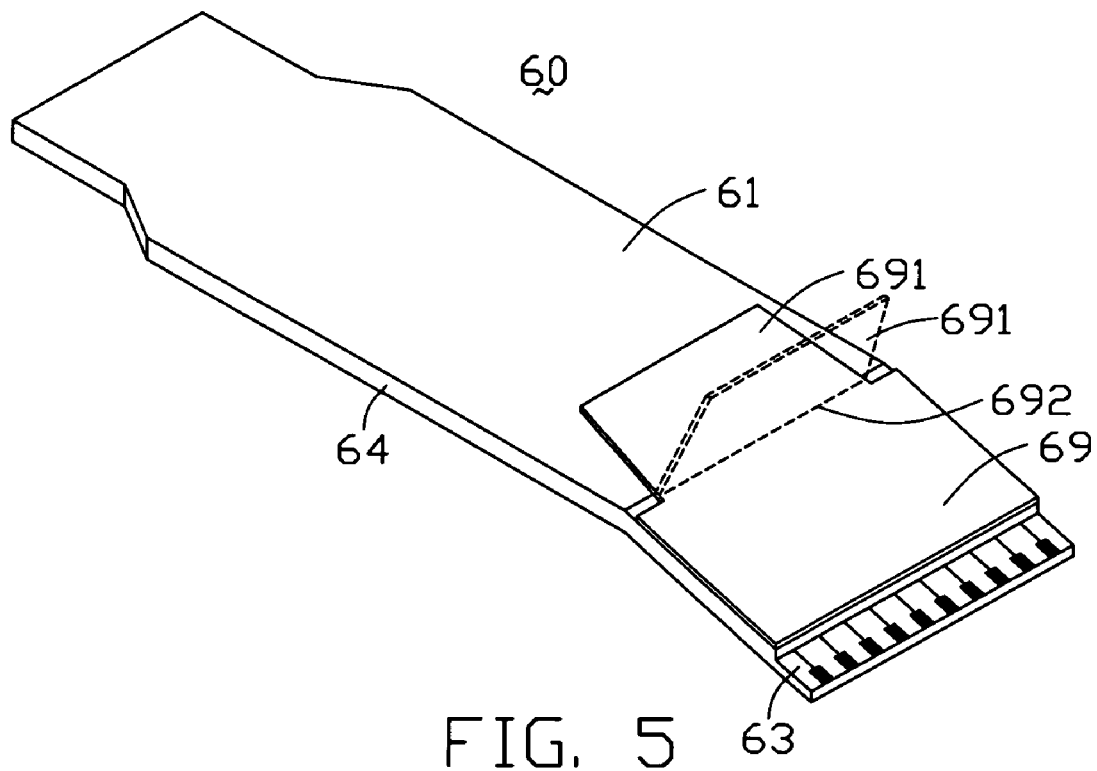
FIG. 5 is an isometric view of a reinforced flexible printed circuit board according to a fifth embodiment of the present invention.

Reference is made to FIG. 5, which is an isometric view of a reinforced flexible printed circuit board 60 according to a fifth embodiment of the present invention. The reinforced flexible printed circuit board 60 includes a flexible printed circuit board 61 and a reinforcement board 69. The flexible printed circuit board 61 includes a first metallic wire layer 63 having a plurality of conductive metallic wires, and a first insulation layer 64. The reinforcement board 69 is made of plastic and includes a hand-grip portion 691 having a bending line 692. Ends of the metallic wires of the first metallic wire layer 63 are exposed. The metallic wires of the first metallic wire layer 63 are partly covered by the first insulation layer 64, and are completely separated from each other by the first insulation layer 64. The reinforcement board 69 is attached to a bent end of the flexible printed circuit board 61 where the ends of the metallic wires of the first metallic wire layer 63 are exposed. The hand-grip portion 691 is integrally formed with and extends from the reinforcement board 69, so that the reinforced flexible printed circuit board 60 will not be unduly bent when the hand-grip portion 691 is manually pushed.

Figure 6A:
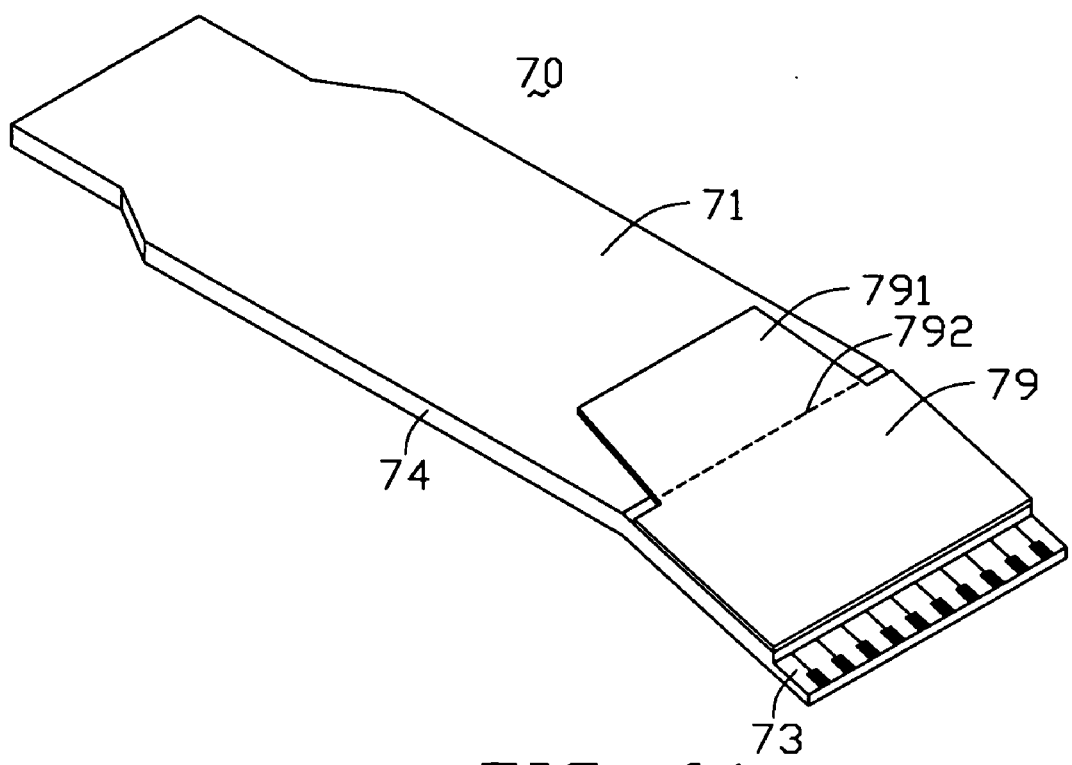
FIG. 6A is an isometric view of a reinforced flexible printed circuit board according to a sixth embodiment of the present invention.
Figure 6B:
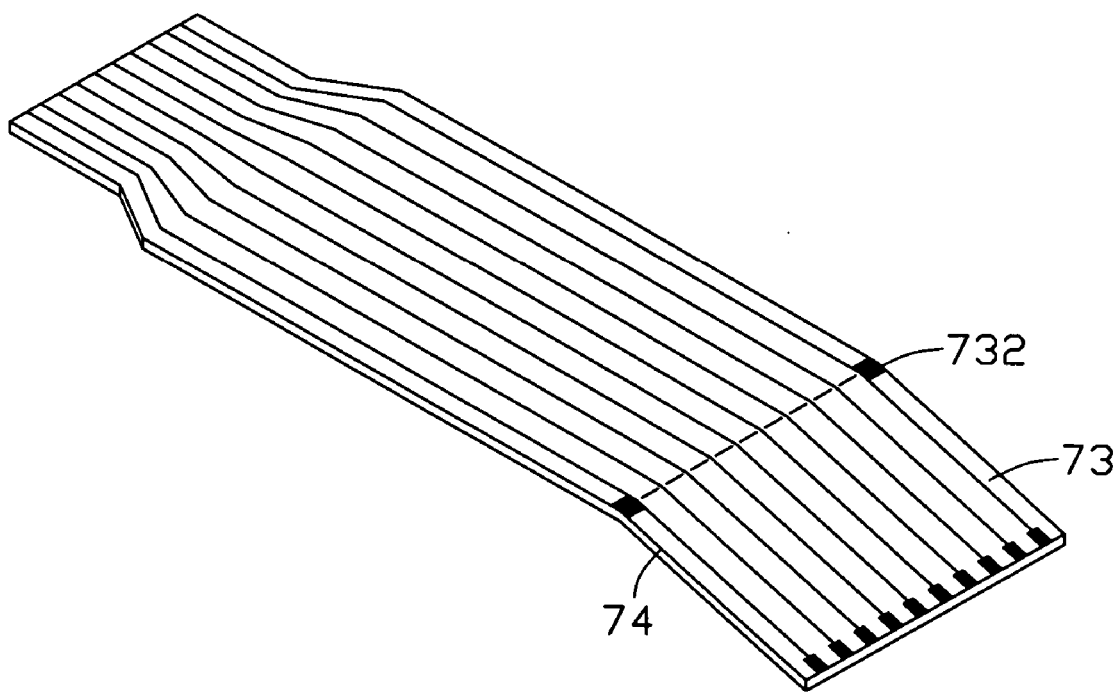
FIG. 6B is an isometric view of part of the reinforced flexible printed circuit board of FIG. 6A, showing a metallic wire layer thereof.
Figure 7:
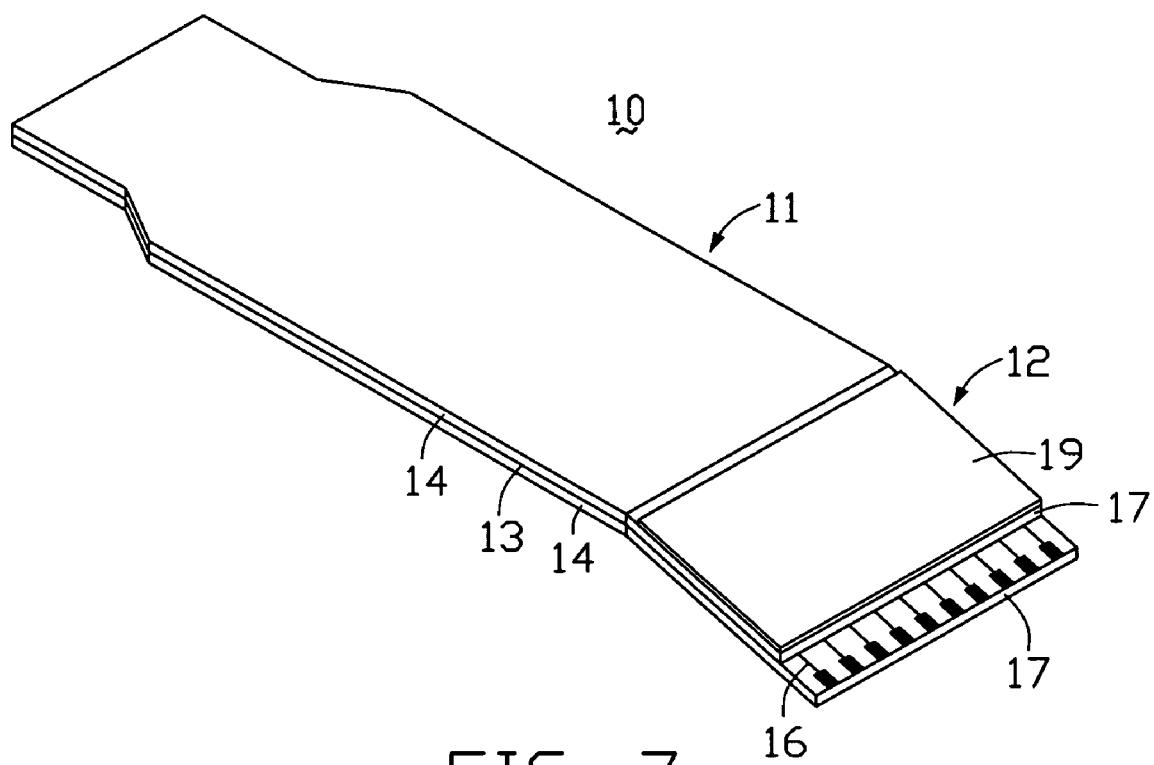
FIG. 7 is an isometric view of a reinforced flexible printed circuit board of the prior art.

Reference is made to FIGS. 6A and 6B, which are isometric views relating to a reinforced flexible printed circuit board 70 according to a sixth embodiment of the present invention. The reinforced flexible printed circuit board 70 includes a flexible printed circuit board 71 and a reinforcement board 79. The flexible printed circuit board 71 includes a first metallic wire layer 73 having a plurality of conductive metallic wires, and a first insulation layer 74. The reinforcement board 79 includes a hand-grip portion 791. Ends of the metallic wires of the first metallic wire layer 73 are exposed. The metallic wires of the first metallic wire layer 73 are partly covered by the first insulation layer 74, and are completely separated from each other by the first insulation layer 74. The hand-grip portion 791 has a bending line 792. The reinforcement board 79 is attached to a bent end of the flexible printed circuit board 71 where the ends of the metallic wires of the first metallic wire layer 73 are exposed, so that the metallic wires of the second metallic wire layer 73 will not be unduly bent when the reinforced flexible printed circuit board 70 is in use. Two spaced-apart copper-covered areas 732 are attached to an area on the first insulation layer 74 where the bent end of the flexible printed circuit board 71 adjoins a main portion of the flexible printed circuit board 71, in order to help prevent the reinforced flexible printed circuit board 70 from being broken by manual handling.

Unlike in the prior art, the reinforcement board of any of the above-described reinforced flexible printed circuit boards includes a hand-grip portion. This makes it is convenient to assemble the reinforced flexible printed circuit board to other components, thereby avoiding misalignments and problems such as open circuits.

It is to be further understood that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A reinforced flexible printed circuit board, comprising:
   a conductive portion, including a first metallic wire layer having a plurality of conductive metallic wires and two first insulation layers, the metallic wires being substantially completely covered by the first insulation layers, and each of the metallic wires being completely separate from the others; and
   a connection portion, including a second metallic wire layer having a plurality of conductive metallic wires, two second insulation layers and a reinforcement board, wherein the reinforcement board includes a hand-grip portion, each of the metallic wires of the second metallic wire layer is completely separate from the others and partly covered by the second insulation layers so that ends of the metallic wires of the second metallic wire layer are exposed, and the metallic wires of the second metallic wire layer correspond wit the metallic wires of the first metallic wire layer; and
   a plurality of copper-covered areas provided in the vicinity of where the reinforcement board is attached to the second insulation layer, the copper-covered areas configured for helping prevent the reinforced flexible printed circuit board from being broken,
   wherein the reinforcement board is attached to one of the second insulation layers, and the hand-grip portion is positioned at one end of the reinforcement board so that mechanical strength of the metallic wires of the second metallic wire layer is enhanced.

2. The reinforced flexible printed circuit board as claimed in claim 1, wherein the hand-grip portion includes a bending line so that the hand-grip portion can be folded or torn off along the bending line.

3. The reinforced flexible printed circuit board as claimed in claim 1, the reinforcement board is made of plastic.

4. A reinforced flexible printed circuit board, comprising;
   a flexible printed circuit board, including a first metallic wire layer having a plurality of conductive metallic wires and two first insulation layers, ends of the metallic wires being exposed, the metallic wires being completely separated from each other by the first insulation layers;
   a reinforcement board, including a main body and a hand-grip portion positioned at an end of the main body, the reinforcement board attached to a portion of the flexible printed circuit board in the vicinity of the exposed ends of the metallic wires for improving mechanical strength of the metallic wires, and the hand-grip portion being distal from the exposed ends of the metallic wires and extending from the main body in a direction generally away from the exposed ends of the metallic wires; and
   two copper-covered areas provided in the vicinity of where the reinforcement board is attached to the flexible printed circuit board, the copper-covered areas configured for helping prevent the reinforced flexible printed circuit board from being broken.

5. The reinforced flexible printed circuit board as claimed in claim 4, wherein the band-grip portion also includes a bending line so that the hand-grip portion can be folded or torn off along the bending line.

6. The reinforced flexible printed circuit board as claimed in claim 4, wherein the reinforcement board is made of plastic.

7. A reinforced flexible printed circuit board, comprising;
   a flexible printed circuit board, including a first metallic wire layer having a plurality of conductive metallic wires and two first insulation layers, ends of the metallic wires being exposed, the metallic wires being completely separated from each other by the first insulation layers;
   a hand-grip portion attached to the flexible printed circuit board and spaced from the exposed ends of the metallic wires along an extension direction of the flexible printed circuit board, and extending in a direction opposite to said ends; and
   a plurality of copper-covered areas provided in the vicinity of where the reinforcement board is attached to the second insulation layer, the copper-covered areas configured for helping prevent the reinforced flexible printed circuit board from being broken.

* * * * *